United States Patent [19]

Sekiguchi et al.

[11] Patent Number: 4,985,597
[45] Date of Patent: Jan. 15, 1991

[54] OPTICAL SEMICONDUCTOR DEVICE

[75] Inventors: Takeshi Sekiguchi; Nobuo Shiga; Keigo Aga, all of Yokohama, Japan

[73] Assignee: Sumitomo Electric Industries, Ltd., Osaka, Japan

[21] Appl. No.: 351,033

[22] Filed: May 12, 1989

[30] Foreign Application Priority Data

May 16, 1988 [JP] Japan ................... 63-118947

[51] Int. Cl.⁵ ........................... H01L 23/055
[52] U.S. Cl. ....................... 174/52.4; 357/74
[58] Field of Search ............ 174/52.4; 357/74

[56] References Cited

U.S. PATENT DOCUMENTS 3,482,198  12/1969  Hopper, Jr. ............... 357/74 X

FOREIGN PATENT DOCUMENTS 2546189  9/1979  Fed. Rep. of Germany.

OTHER PUBLICATIONS

IBM Technical Disclosure Bulletin, vol. 29, No. 4, Sep. 1986, p. 1637, "Selective Etchant for Tin-Lead Composition Determination".
Patent Abstracts of Japan, vol. 10, No. 1, (E-371)(2058), 1/7/86, Fujitsu K.K.

Primary Examiner—Leo P. Picard
Assistant Examiner—David A. Tone
Attorney, Agent, or Firm—Beveridge, DeGrandi & Weilacher

[57] ABSTRACT

Holes are formed in a major surface of a hybrid IC insulating substrate mounting an optical semiconductor element, and terminal pins of a package are connected and fixed to the substrate while head portions of the terminal pins are inserted in the corresponding holes. Since the terminal pins do not protrude outside the major surface of the insulating substrate, a space therefor can be omitted, and the terminal pins are directly connected to the insulating substrate without being separated from each other. Furthermore, since the head portions of the terminal pins are inserted in the corresponding holes of the insulating substrate, they can be automatically aligned. In case that each hole has a tapered inner surface, insertion of the terminal pins can be further facilitated.

19 Claims, 4 Drawing Sheets

OPTICAL SEMICONDUCTOR DEVICE

BACKGROUND OF THE INVENTION

1. Field of the Invention

The present invention relates to an optical semiconductor device used as a transmitting or receiving optical module in an optical communication system.

2. Related Background Art

As a transmitting optical module of this type, a light-emitting element such as a semiconductor laser (LD) or a light-emitting diode (LED) for converting an electrical signal into a light signal and sending the light signal onto an optical fiber and a drive integrated circuit (IC) for driving the light-emitting element are mounted on a single insulating substrate as a hybrid IC, and this substrate is housed in a package. Similarly, as a receiving optical module, a hybrid IC substrate mounting a light-receiving element such as a photodiode (PD) or phototransistor for converting a light signal received from an optical fiber into an electrical signal and an amplifying IC for amplifying the output signal from the light-receiving element is housed in a package.

Each package has a structure having a through hole into which the optical fiber is inserted, and terminal pins used for an electrical input/output operation. The packages are classified into two types according to alignment state of the terminal pins. One of them is, as shown in FIG. 7, a DIP (Dual In-line Package) type in which terminal pins 72 extend from a bottom surface of a package 71 to be substantially perpendicular to the major surface of a hybrid IC substrate 73. The other one is, as shown in FIG. 8, a butterfly type in which terminal pins 82 extend from side surfaces of a package 81 to be substantially parallel to the major surface of a hybrid IC substrate 83. Note that reference numerals 76 and 84 in FIGS. 7 and 8 denote optical fiber insertion ports, respectively.

In the above structure, the hybrid IC substrate 73 or 83 mounting the optical semiconductor device and the IC is assembled inside the alignment of the terminal pins 72 or 82. More specifically, the hybrid IC substrate 73 or 83 is fixed on a substrate base 74 mounted on the bottom surface of the package, and the terminal pins 72 or 82 are aligned to surround the substrate assembly.

For this reason, the package size is increased both in the DIP type and the butterfly type in which the terminal pins extend laterally.

Electrical connections between the hybrid IC substrate 73 or 83 and the terminal pins 72 or 82 are performed through wires 75 or the like. Since a distance between the substrate and each terminal is large, an inductance is increased, and as a result, electrical characteristics are impaired.

Furthermore, since the hybrid IC substrate 73 or 83 is fixed in the package 71 or 81 quite independently of the terminal pin group, it is difficult to align the substrate with the terminal pins.

SUMMARY OF THE INVENTION

It is a main object of the present invention to provide an optical semiconductor device has a small package in size, has good electrical characteristics, and can be very easily achieved alignment of a hybrid IC substrate.

Accordingly the present invention provides an optical semiconductor device in which holes are formed in the major surface of a hybrid IC insulating substrate, and head portions of terminal pins extending from a bottom surface of a DIP type package are inserted in and fixed to these holes.

According to another aspect, the present invention provides an optical semiconductor device in which holes having tapered inner surfaces are formed in the major surface of a hybrid IC insulating substrate, and the terminal pins extending from a bottom surface of a package are connected and fixed to the substrate while head portions of the terminal pins are inserted in these holes.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
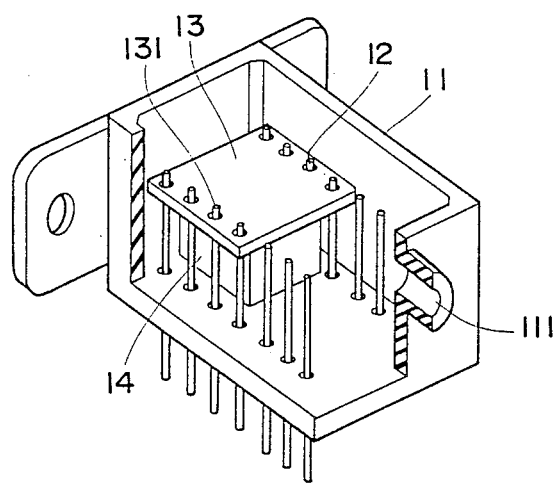
FIG. 1 is a partially cutaway perspective view showing an embodiment of an optical semiconductor device according to the present invention.

FIG. 1 shows a structure of an embodiment of the present invention while removing an upper surface and some side surface portions so that the interior of a package 11 can be seen well. A portion denoted by reference numeral 111 is a cylindrical optical fiber insertion port although only a half portion is illustrated.

The package 11 basically has a DIP structure comprising terminal pins arranged almost perpendicular to the major surface of a hybrid IC substrate 13. Unlike the structure shown in FIG. 7, arrays of terminal pins 12 are located inside the hybrid IC substrate 13.

Figure 2:
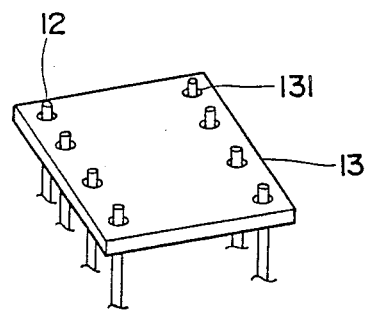
FIG. 2 is a perspective view of a hybrid IC substrate of this embodiment.

The hybrid IC substrate 13 comprises various elements including an optical semiconductor element (not shown) mounted on a ceramic insulating substrate. Holes 131 extending through upper and lower major surfaces are formed in the peripheral portion of the substrate 13, as shown in FIG. 2, and head portions of the terminal pins 12 are inserted therein.

The hybrid IC substrate 13 with the above structure can be relatively easily fabricated in such a manner that the holes 131 are punched in a ceramic substrate still in a soft green sheet state and the substrate is then sintered in the manufacture of the ceramic substrate. Alternatively, holes may be formed in the sintered ceramic substrate by, e.g., boring process using a laser machine tool.

Figure 3:
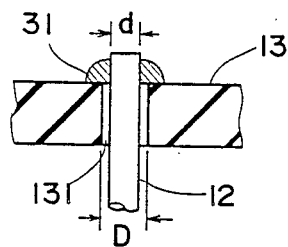
FIG. 3 is a sectional view showing a connecting state of the hybrid IC substrate and one of the terminal pins of the package.

Each terminal pin 12 extends through the bottom surface of the package 11. The head portion of the terminal pin 12 is inserted in the corresponding hole of the hybrid IC substrate 13, and in this state, is directly fixed thereto by a solder 31, as shown in FIG. 3. Thus, the hybrid IC substrate 13 and the terminal pins 12 are mechanically fixed to each other, and a circuit on the hybrid IC substrate 13 and the terminal pins 12 are electrically connected to each other.

Figure 7:
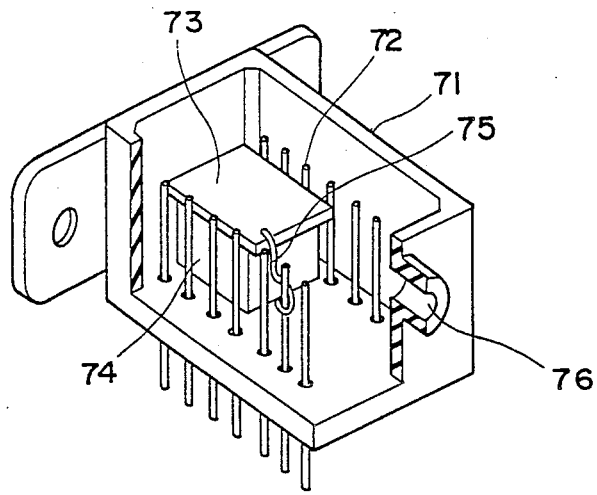
FIGS. 7 and 8 are perspective views showing related background arts of the present invention.
Figure 8:
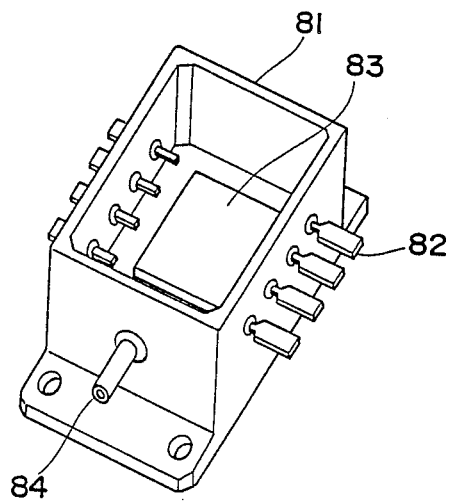

In this manner, since the arrays of the terminal pins 12 pass inside the hybrid IC substrate 13, the necessary space in the package can be reduced as compared to the structure in FIG. 7 in which the arrays of the terminals are arranged outside the substrate.

Unlike the structure in FIG. 7 in which the hybrid IC substrate 73 and the terminal pins 72 are separated from each other, and are connected through lead wires, since the substrate and the terminal pins can be directly soldered to each other, generation of an unnecessary inductance can be minimized.

Furthermore, since the head portions of the terminal pins 12 are inserted in the holes 131 of the hybrid IC substrate 13, the substrate 13 can be automatically aligned with the terminal pins. In this embodiment, the terminal pin 12 has an outer diameter d=0.45 mm, while each hole 131 of the hybrid IC substrate 13 has an inner diameter D=0.7 mm. However, the present invention is not limited to this. For example, a difference between d and D can be so large as to allow easy insertion of the terminal pin 12 in the hole 131 and can be so small as to allow easy soldering therebetween such that the outer surface of the terminal pin 12 is not excessively separate from the inner surface of the hole 131.

In place of the solder 31, another connecting means, e.g., a conductive adhesive may be used to directly fix the terminal pins 12 and the hybrid IC substrate 13.

In the above embodiment, the holes 131 having cylindrical inner surfaces are formed in the hybrid IC substrate 13. However, the hybrid IC substrate 13 may have holes 141 having tapered inner surfaces, as shown in FIG. 4.

The holes 141 can be relatively easily formed in a sintered ceramic substrate by, e.g., a laser machine tool using a YAG laser.

The tapered inner surface of each hole 141 serves as a guide when the corresponding terminal pin 12 is inserted, thus facilitating insertion of the terminal pins 12. In the illustrative embodiment, since the head portion of each terminal pin 12 is also tapered toward the distal end, insertion can be further facilitated.

Figure 4:
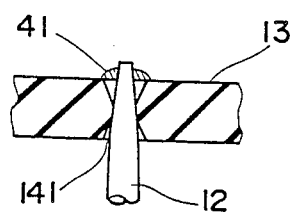
FIG. 4 is a sectional view showing a connecting state of a hybrid IC substrate formed with holes each having a tapered inner surface and a corresponding terminal pin of a package.
Figure 5:
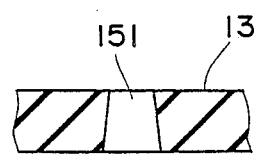
FIGS. 5 and 6 are respectively sectional views showing modifications of the hole having the tapered inner surface.
Figure 6:
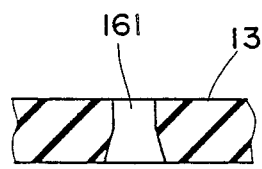

The hole having the tapered inner surface is not limited to one illustrated in FIG. 4. For example, a hole 151 shown in FIG. 5 or a hole 161 shown in FIG. 6 may be employed.

When a metal layer (conductive material layer) of, e.g., gold or aluminum having good conductivity may be formed on the tapered inner surface of each hole 141, 151, or 161 like a viahole in a printed circuit board, electrical contact between the terminal pins 12 and a circuit on the hybrid IC substrate 18 can be improved. Such a metal layer can be formed simultaneously with formation of a metal wiring layer on the major surface of the hybrid IC substrate 13.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. An optical semiconductor device comprising:
   an insulating substrate on which a hybrid integrated circuit including an optical semiconductor element is provided and in which terminal pin insertion holes are provided,
   a package housing said insulating substrate therein,
   a supporting block, provided within said package, for supporting said insulating substrate on the lower surface of said substrate, and
   terminal pins extending from an inner bottom of the package substantially perpendicularly to the upper surface of said insulating substrate, each terminal pin passing through the corresponding terminal pin hole from the lower surface of said insulating substrate to terminate substantially perpendicular to said upper surface and to be electrically connected to said hybrid integrated circuit.

2. An optical semiconductor device according to claim 1, wherein each of the terminal pin insertion holes has a tapered inner surface.

3. An optical semiconductor device according to claim 2, wherein a distal end of each of said terminal pins is tapered.

4. An optical semiconductor device according to claim 3, wherein the terminal pin insertion holes are formed in said insulating substrate by laser machining after said substrate is sintered.

5. An optical semiconductor device according to claim 2, wherein the terminal pin insertion holes are formed in said insulating substrate by laser machining after said substrate is sintered.

6. An optical semiconductor device according to claim 1, wherein a distal end of each of said terminal pins is tapered.

7. An optical semiconductor device according to claim 6, wherein the terminal pin insertion holes are formed in said insulating substrate by laser machining after said substrate is sintered.

8. An optical semiconductor device according to claim 1, wherein the terminal pin insertion holes are formed in said insulating substrate in a soft green sheet state by punching process, and the punched substrate is then sintered.

9. An optical semiconductor device according to claim 1, wherein the terminal pin insertion holes are formed in said insulating substrate by laser machining after said substrate is sintered.

10. An optical semiconductor device according to claim 1, wherein a conductive material layer is formed on the inner surface of each of the terminal pin insertion holes.

11. An optical semiconductor device according to claim 1, wherein said terminal pins are substantially straight in the head portions and the middle portions in which said terminal pins pass through said insulating substrate.

12. An optical semiconductor device comprising an insulating substrate on which a hybrid integrated circuit including an optical semiconductor element is formed and which is housed in a package having terminal pins extending from a bottom of the package substantially perpendicularly to a major surface of said insulating substrate, wherein terminal pin insertion holes are formed in the major surface of said insulating substrate, and said terminal pins are connected and fixed to said insulating substrate while head portions of said terminal pins are inserted in the corresponding holes, a conductive metal layer being formed on the inner surface of each of the terminal pin insertion holes.

13. An optical semiconductor device according to claim 12, wherein a distal end of each of said terminal pins is tapered.

14. An optical semiconductor device according to claim 13, wherein the terminal pin insertion holes are formed in said insulating substrate by laser machining after said substrate is sintered.

15. An optical semiconductor device according to claim 12, wherein the terminal pin insertion holes are formed in said insulating substrate by laser machining after said substrate is sintered.

16. An optical semiconductor device comprising an insulating substrate on which a hybrid integrated circuit including an optical semiconductor element is formed and which is housed in a package having terminal pins extending from a bottom of the package substantially perpendicularly to a major surface of said insulating substrate, wherein terminal pin insertion holes are formed in the major surface of said insulating substrate, and said terminal pins are connected and fixed to said insulating substrate while head portions of said terminal pins are inserted in the corresponding holes, the holes having a tapered inner surface, a conductive material layer being formed on the inner surface of each of the terminal pin insertion holes.

17. An optical semiconductor device according to claim 16, wherein a distal end of each of said terminal pins is tapered.

18. An optical semiconductor device according to claim 17, wherein the terminal pin insertion holes are formed in said insulating substrate by laser machining after said substrate is sintered.

19. An optical semiconductor device according to claim 16, wherein the terminal pin insertion holes are formed in said insulating substrate by laser machining after said substrate is sintered.

* * * * *